(12) United States Patent
Machiguchi et al.

(10) Patent No.: US 7,166,410 B2
(45) Date of Patent: Jan. 23, 2007

(54) COLORED PHOTOSENSITIVE RESIN COMPOSITION AND COLOR FILTER COMPRISING THE SAME

(75) Inventors: Kazuhiro Machiguchi, Osaka (JP); Masanori Shinada, Osaka (JP); Yuuji Ueda, Osaka (JP); Hiroki Endo, Tokyo (JP); Taichi Natori, Tokyo (JP)

(73) Assignees: Sumitomo Chemical Company, Limited, Osaka (JP); Sony Corporation, Tokyo (JP)

( * ) Notice: Subject to any disclaimer, the term of this patent is extended or adjusted under 35 U.S.C. 154(b) by 0 days.

(21) Appl. No.: 10/697,875

(22) Filed: Oct. 31, 2003

(65) Prior Publication Data

US 2004/0131956 A1 Jul. 8, 2004

(30) Foreign Application Priority Data

Nov. 1, 2002 (JP) ............................ 2002-319505

(51) Int. Cl.
- G03C 1/73 (2006.01)
- G03F 7/039 (2006.01)
- G03F 7/20 (2006.01)
- G03F 7/30 (2006.01)
- G03F 7/40 (2006.01)

(52) U.S. Cl. .................. 430/270.1; 430/7; 430/326; 430/905

(58) Field of Classification Search .................. 430/7, 430/270.1
See application file for complete search history.

(56) References Cited

U.S. PATENT DOCUMENTS

| 4,808,501 A | 2/1989 | Chiulli ........................ 430/7 |
| 5,624,781 A * | 4/1997 | Naruse et al. .............. 430/192 |
| 5,876,895 A * | 3/1999 | Hishiro et al. ............. 430/191 |
| 2002/0034697 A1 | 3/2002 | Machiguchi et al. ......... 430/7 |
| 2002/0042008 A1 | 4/2002 | Ueda et al. .................... 430/7 |
| 2002/0045111 A1 | 4/2002 | Machiguchi et al. ......... 430/7 |
| 2004/0082721 A1* | 4/2004 | Miura et al. ................ 525/186 |

FOREIGN PATENT DOCUMENTS

EP 0 483 693 A2 * 5/1992

* cited by examiner

*Primary Examiner*—Sin Lee
(74) *Attorney, Agent, or Firm*—Wenderoth, Lind & Ponack, L.L.P.

(57) ABSTRACT

A positive type colored photosensitive resin composition containing an alkali-soluble copolymer resin which comprises repeating units derived from styrene and repeating units derived from hydroxystyrene, a ratio (molar ratio) of the latter repeating units to the former repeating units is from 1:0.7 to 1:20 and has a polystyrene-converted weight average molecular weight of 6,000 to 15,000.

10 Claims, 2 Drawing Sheets

| G | B | R | G | B | R | G | B | R | G | B | R | G | B | R | G | B | R |
|---|---|---|---|---|---|---|---|---|---|---|---|---|---|---|---|---|---|
| R | G | B | R | G | B | R | G | B | R | G | B | R | G | B | R | G | B |
| B | R | G | B | R | G | B | R | G | B | R | G | B | R | G | B | R | G |
| G | B | R | G | B | R | G | B | R | G | B | R | G | B | R | G | B | R |
| R | G | B | R | G | B | R | G | B | R | G | B | R | G | B | R | G | B |
| B | R | G | B | R | G | B | R | G | B | R | G | B | R | G | B | R | G |
| G | B | R | G | B | R | G | B | R | G | B | R | G | B | R | G | B | R |
| R | G | B | R | G | B | R | G | B | R | G | B | R | G | B | R | G | B |
| B | R | G | B | R | G | B | R | G | B | R | G | B | R | G | B | R | G |
| G | B | R | G | B | R | G | B | R | G | B | R | G | B | R | G | B | R |
| R | G | B | R | G | B | R | G | B | R | G | B | R | G | B | R | G | B |
| B | R | G | B | R | G | B | R | G | B | R | G | B | R | G | B | R | G |
| G | B | R | G | B | R | G | B | R | G | B | R | G | B | R | G | B | R |
| R | G | B | R | G | B | R | G | B | R | G | B | R | G | B | R | G | B |
| B | R | G | B | R | G | B | R | G | B | R | G | B | R | G | B | R | G |

COLORED PHOTOSENSITIVE RESIN COMPOSITION AND COLOR FILTER COMPRISING THE SAME

FIELD OF THE INVENTION

The present invention relates to a colored photosensitive resin composition, a color filter produced using such a colored photosensitive resin composition, and a solid state image pickup device.

PRIOR ART

A solid state image pickup device comprising a charge-coupled device (CCD) uses color filter (2) having a plurality of red pixels (R), green pixels (G) and blue pixels (B), which are arranged on the same plane of support substrate (1) shown in FIG. 1, in a stripe pattern (see FIG. 2) or a mosaic (or lattice) pattern (see FIG. 3). Alternatively, a solid state image pickup device uses a color filter having a plurality of yellow pixels, magenta pixels and cyan pixels in place of red, green and blue pixels.

The color filter is required to have properties to select transmitting light such that it allows only light having the wavelength of the specific color of the respective pixel to pass, while it shields visible light having other wavelength.

For the production of such a color filter, a method for producing a color filter by photolithography using a colored photosensitive resin composition. The colored photosensitive resin composition means a photosensitive resin composition containing a colorant such as a pigment or a dye. This method produces a color filter having a plurality of minute pixels each of which is respectively colored with one of the three primary colors (red, green and blue).

When a color filter having a sufficient optical density is produced using a colored photosensitive resin composition for a color filter containing conventional dyes, it has a thickness of 1.5 µm or more (for example, JP-2002-14220 A, JP-2002-14221 A and JP-2002-14222 A).

With the miniaturization and the increase of definition of CCD, it is desired for a color filter to have finer pixels. That is, when the size of each pixel of the color filter is decreased, CCD on which the color filter is mounted can be miniaturized, and the number of pixels in a unit area is increased so that image information with a high resolution can be obtained.

When the size of the pixel of the color filter is decreased but the color filter has a large thickness, incident light which reaches the color filter from an oblique direction may not reach the photosensitive part of CCD, which is present under the color filter, and thus an image pickup device has no sensitivity with such light that reaches the color filter from the oblique direction.

However, when a positive type colored photosensitive resin composition is used to make a color filter having a thickness of 1.5 µm or less, the color filter does not have a sufficient optical density.

When the amount of a dye is increased while the amounts of other components are decreased to increase the optical density of the positive type colored photosensitive resin composition, a pattern which should remain is dissolved in a developing process after each pixel is projected with a pattern and exposed. This tendency is remarkable, particularly when the amount of a photo active compound is decreased among the other components.

SUMMARY OF THE INVENTION

One object of the present invention is to provide a colored photosensitive resin composition, which has a sufficient optical density and a good color-selecting property as a color filter, which does not leave any residue in a dissolved area in developing when the pixel pattern is developed after being projected and exposed, and which does not suffer from the film reduction of pixels in the developing process and thus it has less color unevenness over the entire surface of the color filter, and also to provide a color filter produced using such a colored photosensitive resin composition. Furthermore, the present invention provides a solid state image pickup device comprising such a color filter.

The above object can be achieved by the use of an alkali-soluble resin, which is a copolymer comprising repeating units derived from styrene and those derived from hydroxystyrene in a specific ratio and has a specific molecular weight, as a base resin of a positive type colored photosensitive resin composition Accordingly, the present invention provides a positive type colored photosensitive resin composition comprising a colorant, a photo active compound, a curing agent, a solvent and an alkali-soluble resin, wherein the alkali-soluble resin is a copolymer comprising repeating units derived from styrene and repeating units derived from hydroxystyrene, a ratio (molar ratio) of the latter repeating units to the former repeating units is from 1:0.7 to 1:20, and the copolymer has a polystyrene-converted weight average molecular weight of 6,000 to 15,000.

The present invention further provides a color filter comprising pixels which are formed using the above positive type colored photosensitive resin composition of the present invention, and also a solid state image pickup device comprising the color filter of the present invention.

DETAILED DESCRIPTION OF THE INVENTION

Figure 1:
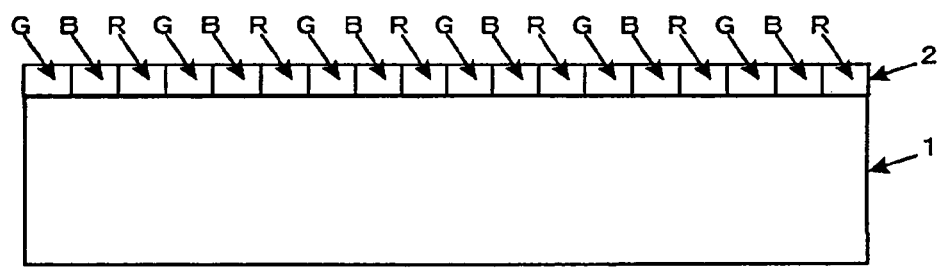
FIG. 1 is a schematic cross section of a color filter on which the pixels of red, green and blue are formed.
Figure 2:
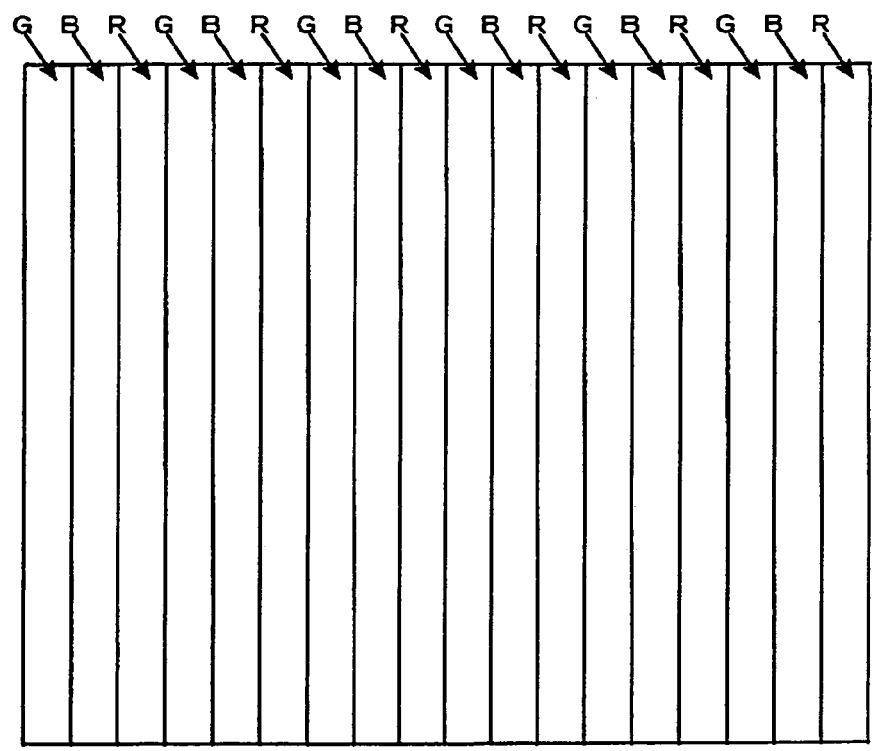
FIG. 2 is a schematic plan view of a color filter on which the pixels of red, green and blue are formed in a stripe pattern.

The colored photosensitive resin composition of the present invention contains a dye as a colorant. The kind of the dye is selected according to the desired color of the color filter, and a combination of plurality of dyes may be used. Preferable dyes have a sufficient solubility in a solvent contained in the colored photosensitive resin composition and also a solubility in a developer sufficient for the formation of a pattern in a developing step in the course of the formation of a pattern.

Examples of dyes which can be used in the present invention include acid dyes and their amide derivatives, oil-soluble dyes, etc. Preferable examples of the dyes include C.I. Acid Blue 83, C.I. Acid Blue 90, C.I. Acid Green 9, C.I. Acid Green 16, C.I. Solvent Yellow 82, C.I. Solvent Yellow 162, C.I. Solvent Orange 56, C.I. Solvent Blue 67, etc.

In addition, a compound of the formula (I)

$$D[(-SO_2NHR^1)_n] \quad (I)$$

wherein D is a basic residue of a dye such as, xanthene compound, triphenylmethane compound, azo compound (such as pyridone azo compound and pyrazolone azo compound), anthraquinone compound, phthalocyanine compound, etc.; n is an integer of 1 to 4; $R^1$ represents an aliphatic hydrocarbon group having 3 to 20 carbon atoms, a cyclohexyl group, an alkylcyclohexyl group having 1 to 4 carbon atoms in the alkyl group, an aliphatic alkoxyalkyl group having 3 to 15 carbon atoms, an aliphatic ester group having 4 to 10 carbon atoms or an arylalkyl group having 6 to 10 carbon atoms in the aryl group and 1 to 5 carbon atoms in the alkyl group, provided that when n is an integer of 2 to 4, substituents $R^1$ may be the same or different.

Specific examples of the aliphatic hydrocarbon group include propyl, hexyl, octyl, decyl, 1-methylbutyl, 1,1,3,3-tetramethylbutyl, 1,5-dimethylhexyl, 1,6-dimethylheptyl, 2-ethylhexyl and 1,5,5-tetramethylhexyl. Specific examples of the alkylcyclohexyl group include 2-methylcyclohexyl and 2-ethylcyclohexyl. Specific examples of the aliphatic alkoxyalkyl group include ethoxypropyl, isopropoxypropyl, octyloxypropyl, 3-ethoxy-n-propyl and 3-(2-ethylhexyloxy)propyl. Specific examples of the aliphatic ester group include propoxycarbonylpropyl, ethoxycarbonylbutyl, propionyloxyethyl and butyryloxybutyl. Specific examples of the arylalkyl group include benzyl, phenethyl and 1-methyl-3-phenylpropyl.

Among the dyes represented by the formula (I), the compound of the following formula (10) is referable:

In the present invention, all the solid components of the resin composition mean total of dyes, photo active compounds, curing agents and alkali-soluble resins.

As the photo active compound contained in the positive type colored photosensitive resin composition of the present invention, esters of phenol compounds and o-naphthoquinonediazidosulfonic acid compounds, and the like can be used. Examples of the phenol compounds include di-, tri-, tetra- and pentahydroxybenzophenone, and a compound of the following formula (11), etc., and examples of the o-naphthoquinonediazoidsulfonic acid compounds include o-naphthoquinonediazido-5-sulfonic acid, o-naphthoquinonediazido-4-sulfonic acid, etc.

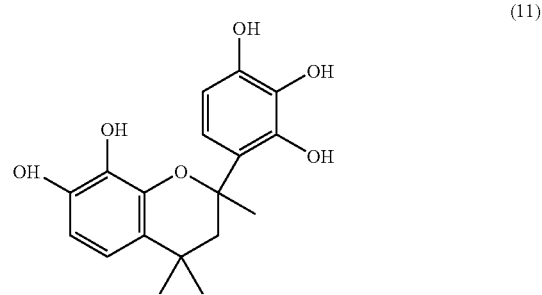

(11)

The positive type colored photosensitive resin composition of the present invention contains a photo active compound usually in an amount of 10 to 30 parts by weight, preferably 15 to 25 parts by weight, more preferably 20 to 25 parts by weight, per 100 parts by weight of all the solid components of the resin composition. When the amount of

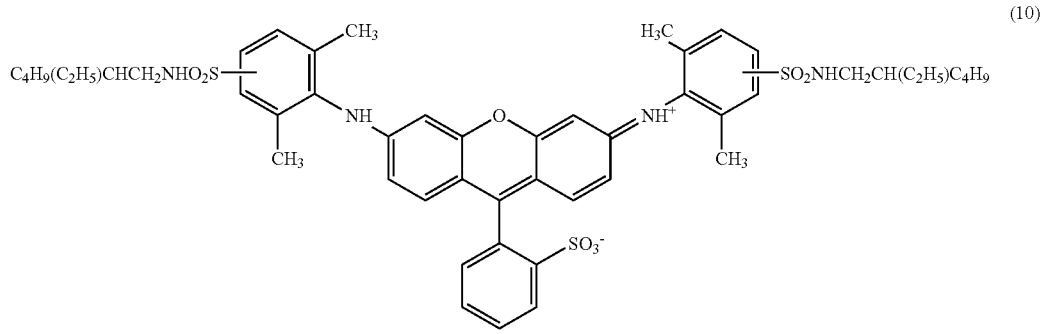

(10)

The positive type colored photosensitive resin composition of the present invention contains a dye usually in an amount of 40 to 70 parts by weight, preferably 50 to 65 parts by weight, more preferably 55 to 65 parts by weight, per. 100 parts by weight of all the solid components of the resin composition. When the amount of the dye is from 40 to 70 parts by weight, the color filter has a sufficient optical density at the intended film thickness of the color filter, and the pixels formed are suitably dissolved in an alkaline developer in the developing process but the film reduction hardly occurs.

the photo active compound is from 10 to 30 pars by weight, the exposure portion in the colored photosensitive resin layer of substrate are suitably dissolved in an alkaline developer in the developing process but the film reduction hardly occurs, and an exposure time for changing the quinonediazide compound of the photo active compound to an indene carboxylic acid can be shortened so that a production efficiency may not be deteriorated.

The curing agent contained in the positive type colored photosensitive resin composition of the present invention may be a hot curing agent which cures the resin by heating.

A typical example of the hot curing agent is a compound of the formula (12):

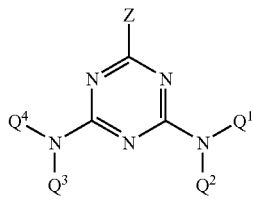

(12)

wherein $Q^1$ to $Q^4$ represent independently each other a hydrogen atom, a hydroxyalkyl group having 1 to 4 carbon atoms, or an alkyl group having 1 to 4 carbon atoms which is substituted with at least one alkoxyl group having 1 to 4 carbon atoms. Z is a phenyl group or a substituent of the formula (13):

$$Q^5Q^6N— \qquad (13)$$

in which $Q^5$ and $Q^6$ represent independently each other a hydrogen atom, a hydroxyalkyl group having 1 to 4 carbon atoms, or an alkyl group having 1 to 4 carbon atoms which is substituted with at least one alkoxyl group having 1 to 4 carbon atoms, provided that at least one of $Q^1$ to $Q^6$ is a hydroxyalkyl group having 1 to 4 carbon atoms or an alkyl group having 1 to 4 carbon atoms which is substituted with at least one alkoxyl group having 1 to 4 carbon atoms.

Examples of the hydroxyalkyl group having 1 to 4 carbon atoms include hydroxymethyl, hydroxyethyl, hydroxypropyl, hydroxybutyl, etc., and examples of the alkyl group having 1 to 4 carbon atoms which is substituted with at least one alkoxyl group having 1 to 4 carbon atoms include methoxymethyl, methoxyethyl, ethoxyethyl, propoxybutyl, etc.

Typical examples of the compound of the formula (13) include hexamethoxymethylmelamine, etc.

The positive type colored photosensitive resin composition of the present invention contains a curing agent usually in an amount of 10 to 20 parts by weight, preferably 13 to 20 parts by weight, more preferably 15 to 18 parts by weight, per 100 parts by weight of all the solid components of the resin composition. When the amount of the curing agent is from 10 to 20 pars by weight, the pixels formed are not dissolved in an alkaline developer before being thermally cured and thus the film reduction hardly occurs, and the pixels have sufficient mechanical properties since the pixels are sufficiently cured when they are thermally cured.

The colored photosensitive resin composition of the present invention contains a solvent. The kind of the solvent is selected depending on the solubilities of the components of the resin composition, that is, the dye, photo active compound, alkali-soluble resin and curing agent, in particular, the solubility of the dye.

Specific examples of the solvent include methyl cellosolve, ethyl cellosolve, methyl cellosolve acetate, ethyl cellosolve acetate, diethylene glycol dimethyl ether, ethylene glycol monoisopropyl ether, propylene glycol monomethyl ether, N-methylpyrrolidone, γ-butyrolactone, dimethylsulfoxide, N,N'-dimethylformamide, cyclohexane, ethyl acetate, n-butyl acetate, propylene glycol monoethyl ether acetate, ethyl pyruvate, ethyl lactate, etc. Among them, ethyl lactate, N,N-dimethyhlformamide and the like are preferable. These solvents may be used independently or as a mixture of two or more.

The amount of the solvent contained in the colored photosensitive resin composition of the present invention is usually from 230 to 400 parts by weight, preferably from 250 to 300 parts by weight, per 100 parts by weight of the solid components of the resin composition. When the amount of the solvent is from 230 to 400 parts by weight, the viscosity of the colored photosensitive resin composition does not excessively increase so that it is not necessary to decrease a rotation speed in the case of a spin coating to form a film having a desired thickness, and a coated film with good evenness can be formed.

The colored photosensitive resin composition of the present invention contains, as an alkali-soluble resin, a copolymer comprising repeating units derived from styrene and repeating units derived from hydroxystyrene, in which the ratio (molar ratio) of the latter repeating units to the former repeating units is from 1:0.7 to 1:20. When the molar ratio of the latter repeating units to the former ones is less than 1:0.7, the solubility of the pattern formed from the colored photosensitive resin composition in the alkaline developer increases so that the film thicknessis reduced when the pixels of the color filter are developed. When the above ratio exceeds 1:20, the solubility of the exposure portion of the colored photosensitive resin layer in the alkaline developer decreases so that the undissolved residues may remain when the pixels of the color filter are developed and thus it may be difficult to form pixels.

In addition, the alkali-soluble resin used in the present invention has a polystyrene-converted weight average molecular weight of 6,000 to 15,000, preferably 7,000 to 14,000, more preferably 9,000 to 14,000. When the polystyrene-converted weight average molecular weight of the alkali-soluble resin is less than 6,000, the solubility of the pattern formed from the colored photosensitive resin composition in the alkaline developer increases so that the film thickness is reduced when the pixels of the color filter are developed. When the polystyrene-converted weight average of the alkali-soluble resin exceeds 15,000, the solubility of the exposure portion of the colored photosensitive resin layer in the alkaline developer decreases so that the undissolved residues may remain when the pixels of the color filter are developed and thus it may be difficult to form pixels.

The colored photosensitive resin composition of the present invention may contain a novolak resin in combination with the above-described alkali-soluble resin as long as the effects of the present invention are not interfered with. Examples of the novolak resin include a p-cresol novolak resin, a m-cresol novolak resin, and a novolak resin having a structure of the formula (14):

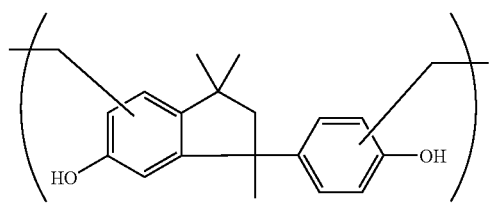

(14)

The amount of the alkali-soluble resin in the colored photosensitive resin composition of the present invention is usually 20 parts by weight or less, for example, 1 to 20 parts by weight, preferable from 1 to 10 parts by weight, more preferably from 1 to 5 parts by weight, per 100 parts by weight of all the solid components of the resin composition. When the amount of the alkali-soluble resin is 1 to 20 parts by weight, the color filter has less color unevenness, and the undissolved residues are less formed in the dissolved parts in the developing process of the pixel formation.

The colored photosensitive resin composition of the present invention usually comprises 40 to 70 parts by weight of a dye, 10 to 30 parts by weight of a photo active compound, 10 to 20 parts by weight of a curing agent and 1 to 20 parts by weight of an alkali-soluble resin, preferably 50 to 65 parts by weight of a dye, 15 to 25 parts by weight of a photo active compound, 13 to 20 parts by weight of a curing agent and 1 to 5 parts by weight of an alkali-soluble resin, per 100 parts by weight of all the solid components of the resin composition.

The amounts (parts by weight) of the photo active compound, curing agent and alkali-soluble resins may be suitably selected from the above ranges depending of the control of the projection exposed amount of the pixel pattern, the control of the film reduction of the pixel pattern in the development, the control of the mechanical strength of the pixel pattern, and so on.

The colored photosensitive resin composition of the present invention can provide a color filter having a thickness of 1.5 μm or less, preferably from 0.8 to 1.4 μm, more preferably from 1.0 to 1.2 μm, and a pattern area with a width and a length of 2 to 20 μm.

The color filter can be formed by a photolithography method as in the case of conventional colored photosensitive resin compositions. For example, a coating layer of the colored photosensitive resin composition of the present invention is formed on a surface of a support, volatile components are removed from the coating layer, and then the coating layer is exposed to light through a mask and developed to form a pattern. As a support, a silicon wafer on which CCD is formed, a transparent glass plate, etc. can be used.

To form the coating layer, the positive type colored photosensitive resin composition of the present invention is coated on the support by a conventional coating method such as spin coating, dip coating, cast coating, roll coating, slit-and-spin coating, and the like. After coating, the support carrying the coating layer may be heated at a temperature of 80 to 130° C. to evaporate the volatile components such as a solvent to obtain the coated film consisting of the solid components of the colored photosensitive resin composition of the present invention.

Thereafter, the coated film is exposed to light. To this exposure, a masking pattern having a pattern corresponding to an intended pattern to be formed is used, and the light beam is irradiated to the coated film through the masking pattern. As a light source, g-line, i-line, etc. can be used. In concrete, an exposing apparatus such as a g-line stepper, an i-line stepper, etc. can be used. After exposure, the coated film may optionally be heated. When the coated film is heated, a temperature is from 80 to 150° C.

After exposure, the coated film is developed. The coated film can be developed by dipping the support carrying the coated film thereon in a developer in the same way as in the case of the conventional colored photosensitive resin composition being used. As a developer, the same developer as one used to form a pattern with the conventional colored photosensitive resin composition may be used. After dipping, the support is pulled out from the developer and washed with water to remove the developer. Thereby, a color filter having patterned areas colored with the respective color is obtained. Alternatively, the support may be pulled out from the developer, rinsed with a rinsing liquid, and then washed with water. The rinsing can remove the residue of the colored photosensitive resin composition remaining on the support after development.

The pattern obtained may be irradiated with UV ray. The irradiation with UV ray can decompose the remaining photo active compound in the pixels formed. After washing with water, the support is heated to improve the mechanical strength of the color filter pattern. The heating temperature is from 160° C. to 220° C., and usually a temperature lower than the decomposition temperature of the dye.

As described above, the color filter pixels with the desired pattern is formed. When the above steps for forming the pattern of the color filter are repeated with each color, the pixels of three colors, that is, the pixels of red, green and blue, are formed on the same plane of the support. According to the present invention, no residue remains in the dissolved areas on the substrate, on which the color filter pixels are formed, after developing. Accordingly, there is no mixing of the colors of the color filter and thus the color selectivity of the color filter is improved. Furthermore, each pixel formed preferably has a tapered cross section.

The color filter of the present invention may be formed by on-chip on the front face of a solid state image pickup device such as CCD or CMOS. In such a method, CCD or CMOS is formed on a silicon wafer substrate, and the layer of a flat film-forming agent is formed over the whole surface of the substrate. Then, the color filters of the respective colors are formed on the same plane by the above-described method. Alternatively, the color filters may be formed directly on the uneven parts of the solid state image pickup device without forming the layer of a flat film-forming agent.

Figures 3, 4:
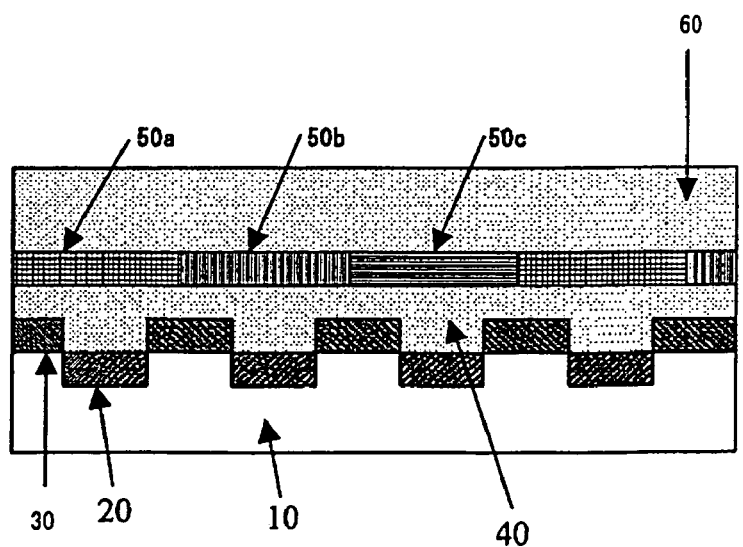
FIG. 3 is a schematic plan view of a color filter on which the pixels of red, green and blue are formed in a mosaic pattern.
FIG. 4 is a schematic cross section of a solid state image pickup device having a color filter formed on a photoreceptor.

A solid state image pickup device comprising such a color filter may be produced by a conventional method. For example, a solid state image pickup device having a color filter on a photoreceptor, the cross section of which is shown in FIG. 4, is produced as follows:

Firstly, photoreceptors 20 are formed on the surface of a silicon wafer and then transfer electrodes 30, which transfer electrons from the photoreceptor, are formed on the surface of the silicon waver to produce a substrate of a solid state image pickup device, that is, a substrate having photoreceptors 20 and transfer electrodes 30 thereon. Before forming a color filter on the substrate, flat film-forming layer 40 is formed on the surface of the substrate. Thereafter, the colored photosensitive composition of the present invention is applied on the surface of flat film-forming layer 40 formed on the substrate, a pattern is projected, exposed and developed, followed by thermal curing to form a color filter of color pixels 50a. Thereafter, the above steps are repeated using a colored photosensitive composition comprising a dye of other color to form color filters of color pixels 50b and 50c. Finally, protective film 60 is formed to protect the surface of the color filters.

The preferred embodiments of the present invention have been explained by way of examples, but they do not limit the scope of the present invention. The scope of the present invention should be determined only by the claims appended hereto, and includes variations and modifications thereto.

EXAMPLES

Hereinafter, the present invention will be illustrated by the following examples, which do not limit the scope of the present invention in any way.

In the Examples, "parts" are "parts by weight".

Example 1

A photosensitive resin composition was prepared by mixing 2.0 parts of a compound of the formula (10):

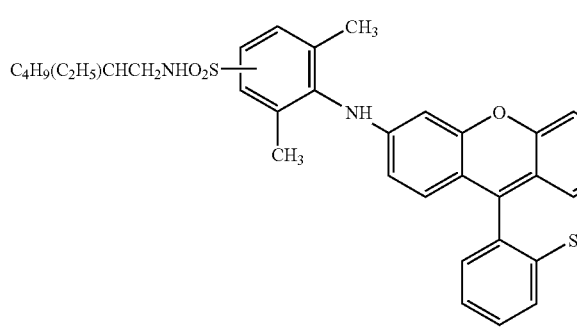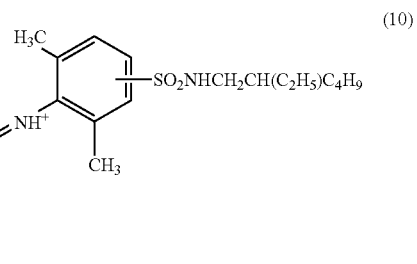

(10)

as a dye, 2.0 parts of C.I. Solvent Orange 56 as a dye, 2.0 parts of C.I. Solvent Yellow 162 as a dye, 2.0 parts of the ester of a phenol compound of the formula (11) with o-naphthoxydiazide-5-sulfonic acid as a photo active compound, 0.2 part of a copolymer resin comprising repeating units derived from styrene and repeating units derived from hydroxystyrene (manufactured by Maruzen Oil Co., Ltd.; content of the repeating units derived from hydroxystyrene: 15% by mole based on the whole repeating units; polystyrene-converted weight average molecular weight: 9,300) as an alkali-soluble resin, 1.6 parts of hexamethoxymethylmelamine as a curing agent, 20.0 parts of ethyl lactate as a solvent and 9.0 parts of N,N-dimethylformamide, and filtrating the mixture with a membrane filer having a pore size of 0.1 µm.

SUMIRESIST PR-1300Y-PG (manufactured by Sumitomo Chemical Co., Ltd.) as a flat film-forming agent was spin coated on a silicon wafer and heated at 100° C. for 1 minute to remove volatile materials to form a coating film having a thickness of 0.5 µm. Then, the wafer was heated at 230° C. for 15 minutes to cure the coating film. Thereby, a support was obtained. On this support, the photosensitive resin composition prepared in the above step was spin coated and heated at 100° C. for 1 minute to remove volatile materials to form a coating film. Thereafter, the coating film of the photosensitive resin composition was irradiated with i-line through a masking pattern using a wafer stepper (Nikon NSR i7A manufactured by Nikon Corporation) at an exposing intensity of 1,300 mJ. After exposure, the wafer was dipped in a developer (SOPD manufactured by Sumitomo Chemical Co., Ltd.) at 23° C. for 30 seconds to develop the exposed coating layer. After development, the wafer was rinsed with a rinse liquid (1.9 wt. % aqueous solution of tetramethylammonium hydroxide containing 0.15% by weight of polyoxyethylene nonylphenyl ether), washed with water, dried, irradiated with UV ray and then heated at 180° C. for 3 minutes to obtain a color filter having red pixels which were formed in a stripe pattern having a line width of 1.0 µm and a thickness of 1.0 µm.

The cross section of the stripe pattern was observed with a scanning electron microscope. The stripe pattern had a trapezi form cross section and an angle of about 80 degrees between the base and each side of the trapezoid. The observation of the pixels with the scanning electron microscope confirmed that no residue of dissolved parts in development remained.

A color filter having red pixels which were formed in a mosaic pattern having a line width of 2.0 µm and a thickness of 1.0 µm was produced in the same manner as above except that a masking pattern was changed.

Furthermore, a color filter having red pixels, which were formed all aver the surface of a support and had a thickness of 1.0, was produced in the same manner as above except that a glass plate was used as a support and the coating film of the photosensitive resin composition was developed without exposure.

Example 2

A color filter having red pixels was produced in the same manner as in Example 1 except that 0.2 part of a copolymer resin comprising styrene and hydroxystyrene (manufactured by TriQuest; content of the repeating units derived from hydroxystyrene: 10% by mole based on the whole repeating units; polystyrene-converted weight average molecular weight: 13,500) was used in place of the copolymer resin of styrene and hydroxystyrene manufactured by Maruzen Oil Co., Ltd.

Example 3

A color filter having red pixels was produced in the same manner as in Example 1 except that 1.6 parts of the ester of a phenol compound of the formula (11) with o-naphthoquinonediazido-5-sulfonic acid as a photo active compound, 0.6 part of the same copolymer resin as one used in Example 1 as an alkali-soluble resin.

Example 4

A photosensitive resin composition was prepared by mixing 17.5 parts of C.I. Solvent Blue 67, 4.5 parts of C.I. Acid Green 16, 22.5 parts of C.I. Solvent Yellow 162 and 4.0 parts of C.I. Solvent Yellow 82 as dyes, 30.0 parts of the ester of a phenol compound of the formula (11) with o-naphthoquinonediazido-5-sulfonic acid as a photo active compound, 3.0 parts of a novolak resin of p-cresol (polystyrene-converted weight average molecular weight: 6,000) as an alkali-soluble resin, 2.0 parts of the same copolymer resin as one used in Example 1 as an alkali-soluble resin, 16.0 parts of hexamethoxymethylmelamine as a curing agent, 175.0 parts of ethyl lactate as a solvent and 75.0 parts of N,N-dimethylformamide, and filtrating the mixture with a membrane filer having a pore size of 0.1 μm.

The same flat film-forming agent as one used in Example 1 was spin coated on a silicon wafer and heated at 100° C. for 1 minute to remove volatile materials to form a coating film having a thickness of 0.5 μm. Then, the wafer was heated at 230° C. for 15 minutes to cure the coating film. Thereby, a support was obtained. On this support, the photosensitive resin composition prepared in the above step was spin coated and heated at 100° C. for 1 minute to remove volatile materials to form a coating film. Thereafter, the coating film of the photosensitive resin composition was irradiated with i-line through a masking pattern using the same wafer stepper as one used in Example 1 at an exposing intensity of 2,000 mJ. After exposure, the wafer was dipped in the same developer as one used in Example 1 at 23° C. for 30 seconds to develop the exposed coating layer. After development, the wafer was rinsed with the same rinse liquid as one used in Example 1, washed with water, dried, irradiated with UV ray and then heated at 180° C. for 3 minutes to obtain a color filter having green pixels which were formed in a stripe pattern having a line width of 1.0 μm and a thickness of 1.0 μm.

The cross section of the stripe pattern was observed with a scanning electron microscope. The stripe pattern had a trapezi form cross section and an angle of about 80 degrees between the base and each side of the trapezoid. The observation of the pixels with the scanning electron microscope confirmed that no residue of dissolved parts in development remained.

A color filter having green pixels which were formed in a mosaic pattern having a line width of 2.0 μm and a thickness of 1.0 μm was produced in the same manner as above except that a masking pattern was changed.

Furthermore, a color filter having green pixels which were formed all aver the surface of a support and had a thickness of 1.0 μm was produced in the same manner as above except that a glass plate was used as a support and the coating film of the photosensitive resin composition was developed without exposure.

Example 5

A photosensitive resin composition was prepared by mixing 0.6 part of a compound of the formula (10) as a dye, 1.0 part of C.I. Solvent Blue 67 as a dye, 2.4 parts of C.I. Acid Blue 90 as a dye, 3.0 parts of the ester of a phenol compound of the formula (11) with o-naphtoquinonediazide-5-sulfonic acid as a photo active compound, 0.2 part of the same copolymer resin as one used in Example 1 as an alkali-soluble resin, 0.5 part of the same novolak resin as one used in Example 4 as an alkali-soluble resin, 2.3 parts of hexamethoxymethylmelamine as a curing agent, 28.0 parts of ethyl lactate as a solvent and 12.0 parts of N,N-dimethylformamide, and filtrating the mixture with a membrane filer having a pore size of 0.1 μm.

The same flat film-forming agent as one used in Example 1 was spin coated on a silicon wafer and heated at 100° C. for 1 minute to remove volatile materials to form a coating film having a thickness of 0.5 μm. Then, the wafer was heated at 230° C. for 15 minutes to cure the coating film. Thereby, a support was obtained. On this support, the photosensitive resin composition prepared in the above step was spin coated and heated at 100° C. for 1 minute to remove volatile materials to form a coating film. Thereafter, the coating film of the photosensitive resin composition was irradiated with i-line through a masking pattern using the same wafer stepper as one used in Example 1 at an exposing intensity of 450 mJ. After exposure, the wafer was dipped in the same developer as one used in Example 1 at 23° C. for 30 seconds to develop the exposed coating layer. After development, the wafer was rinsed with the same rinse liquid as one used in Example 1, washed with water, dried, irradiated with UV ray and then heated at 180° C. for 3 minutes to obtain a color filter having blue pixels which were formed in a stripe pattern having a line width of 1.0 μm and a thickness of 0.95 μm.

The cross section of the stripe pattern was observed with a scanning electron microscope. The stripe pattern had a trapezi form cross section and an angle of about 80 degrees between the base and each side of the trapezoid. The observation of the pixels with the scanning electron microscope confirmed that no residue of dissolved parts in development remained.

A color filter having blue pixels which were formed in a mosaic pattern having a line width of 2.0 μm and a thickness of 0.95 μm was produced in the same manner as above except that a masking pattern was changed.

Furthermore, a color filter having blue pixels which were formed all aver the surface of a support and had a thickness of 0.95 μm was produced in the same manner as above except that a glass plate was used as a support and the coating film of the photosensitive resin composition was developed without exposure.

Comparative Example 1

A color filter having red pixels was produced in the same manner as in Example 1 except that 0.2 part of a novolak resin of p-cresol (polystyrene-converted weight average molecular weight: 6,000) was used in place of the copolymer resin of styrene and hydroxystyrene.

Comparative Example 2

A color filter having green pixels was produced in the same manner as in Example 4 except that 5.0 parts of a novolak resin of p-cresol (polystyrene-converted weight average molecular weight: 6,000) was used but no copolymer resin of styrene and hydroxystyrene was used.

Comparative Example 3

A color filter having blue pixels was produced in the same manner as in Example 5 except that 0.2 part of a novolak resin of p-cresol (polystyrene-converted weight average molecular weight: 6,000) was used in place of the copolymer resin of styrene and hydroxystyrene.

Evaluations of Color Filters (1) Selectivity of Transmitting Light

With the color filter having pixels of the respective color all over the surface of the glass substrate, a light transmittance was measured at a wavelength of 450 nm, 540 nm and 650 nm. The results are shown in Table 1.

(2) Residual Rate of Film in Development

With the color filters produced in Examples 1–4 and Comparative Examples 1–3, the film thickness of the pixels, which were formed using the positive type colored photosensitive resin compositions, was measured before and after the development with an alkali developer in the process of forming the color filter pattern. The results are shown in Table 2.

TABLE 1

| Example No. | Film thickness (μm) | Light transmittance (%) at a wavelength of | | |
|---|---|---|---|---|
| | | 450 nm | 540 nm | 650 nm |
| 1 | 1.00 | 0.8 | 0.5 | 96.1 |
| 2 | 1.00 | 0.7 | 0.6 | 96.3 |
| 3 | 1.00 | 0.8 | 0.5 | 96.1 |
| 4 | 1.00 | 0.4 | 68.0 | 4.0 |
| 5 | 0.95 | 81.6 | 9.5 | 2.4 |

TABLE 2

| Example No. | Film thickness (μm) | | Residual rate of film[*1] (%) |
|---|---|---|---|
| | before development | after development | |
| 1 | 1.00 | 0.97 | 97.0 |
| 2 | 1.00 | 0.97 | 97.0 |
| 3 | 1.00 | 0.98 | 98.0 |
| 4 | 1.00 | 0.97 | 97.0 |
| 5 | 0.95 | 0.93 | 97.9 |
| C. 1 | 1.00 | 0.94 | 94.0 |
| C. 2 | 1.00 | 0.95 | 95.0 |
| C. 3 | 0.95 | 0.90 | 94.7 |

[*1]Residual rate of film = [(film thickness after development)/(film thickness before development)] × 100

The films produced in Examples 1–5 had larger residual rates of film than those produced in Comparative Examples 1–3. Thus, the color filters produced in Examples 1–5 could have the color filter pattern with a uniform thickness and thus they had less color unevenness.

As described above, when the positive colored photosensitive resin composition is used, the color filter having a thickness of 1.5 μm or less can have a sufficient optical density and good color selectivities, suffers less film reduction, and has good solvent resistance and less color unevenness all over the surface of the color filter.

What is claimed is:

1. A positive type colored photosensitive resin composition comprising a copolymer which consists essentially of repeating units derived from styrene and repeating units derived from hydroxystyrene, a ratio (molar ratio) of the latter repeating units to the former repeating units is from 1:0.7 to 1:20 and has a polystyrene-converted weight average molecular weight of 6,000 to 15,000, as an alkali-soluble resin and does not contain a novolak resin, wherein the alkali soluble resin is contained in said composition in an amount of 1 to 20 parts by weight per 100 parts by weight of the said components of the resin composition.

2. The positive type colored photosensitive resin composition according to claim 1, which comprises a positive type colored photosensitive resin composition comprising a photo active compound, a curing agent and a solvent in addition to the alkali-soluble resin.

3. The positive type colored photosensitive resin composition according to claim 2, which contains the photo active compound in an amount of 10 to 30 parts by weight per 100 parts by weight of the solid components of the resin composition.

4. The positive type colored photosensitive resin composition according to claim 2, which contains the curing agent in an amount of 10 to 20 parts by weight per 100 parts by weight of the solid components of the resin composition.

5. The positive type colored photosensitive resin composition according to claim 2, which contains the solvent in an amount of 230 to 400 parts by weight per 100 parts by weight of the solid components of the resin composition.

6. The positive type colored photosensitive resin composition according to claim 1, which contains a dye in an amount of 40 to 70 parts by weight per 100 parts by weight of the solid components of the resin composition.

7. The positive type colored photosensitive resin composition according to claim 1, which comprises 40 to 70 parts by weight of a dye, 10 to 30 parts by weight of a photo active compound, and 10 to 20 parts by weight of a curing agent.

8. A color filter formed of a colored photosensitive resin composition according to claim 1.

9. The color filter according to claim 8, which has plural patterns of different colors and which is produced by applying a colored photosensitive resin composition according to claim 1 which has a first color, removing volatile components from the applied resin composition to form a coating film, exposing the coating film through a mask, developing the exposed coating film and heating and curing the developed coating film to form pixels, then repeating the above steps using a colored photosensitive resin composition according to claim 1 having a second color which is different from the first color, and repeating the above steps using a colored photosensitive resin composition according to claim 1 having a third color which is different from the first and second colors.

10. A solid state image pickup device comprising a color filter according to claim 8 or 9.

* * * * *